United States Patent [19]
Matsutani et al.

[11] Patent Number: 4,918,499
[45] Date of Patent: Apr. 17, 1990

[54] SEMICONDUCTOR DEVICE WITH IMPROVED ISOLATION BETWEEN TRENCH CAPACITORS

[75] Inventors: Takeshi Matsutani, Machida; Kazunori Imaoka, Komae, both of Japan

[73] Assignee: Fujitsu Limited, Kawasaki, Japan

[21] Appl. No.: 256,412

[22] Filed: Oct. 12, 1988

[30] Foreign Application Priority Data

Nov. 13, 1987 [JP]  Japan .................................. 62-285440

[51] Int. Cl.⁴ ............................................ H01L 21/00
[52] U.S. Cl. .................................... 357/23.6; 357/49; 357/54; 357/55
[58] Field of Search ..................... 357/23.6, 49, 54, 55

[56] References Cited
FOREIGN PATENT DOCUMENTS
62-33450  2/1987  Japan .................................. 357/23.6

Primary Examiner—Andrew J. James
Assistant Examiner—David Soltz
Attorney, Agent, or Firm—Staas & Halsey

[57] ABSTRACT

A semiconductor device includes trench capacitors formed in a semiconductor substrate, a trench provided therebetween for isolating the trench capacitors, and a trench capacitor formed in a side wall of the trench for isolating the trench capacitors.

5 Claims, 7 Drawing Sheets

SEMICONDUCTOR DEVICE WITH IMPROVED ISOLATION BETWEEN TRENCH CAPACITORS

BACKGROUND OF THE INVENTION

1. Field of the Invention

The present invention relates to a semiconductor device and a method for producing same. More particularly, it relates to a semiconductor device having a memory structure suitable for a high degree of integration and a method for producing same.

2. Description of the Related Art

Recently, in a semiconductor device having a memory structure with a capacitor, for example, a Dynamic Random Access Memory (DRAM), various structures have been proposed by which the degree of integration can be increased.

An increase of a degree of integration of a planar type DRAM has been limited, and thus, to increase the degree of integration, a tertiary structure has been developed.

A stacked type or trench type structure are well known tertiary structures but an increase of the degree of integration of the stacked type capacitor is also limited, and therefore, the trench type capacitor is widely used at present as a DRAM capacitor.

FIG. 1 is a conventional example in which trench type capacitors are provided with a LOCUS type isolation therebetween.

In FIG. 1, a p+ silicon layer 2, n+ silicon region, n+ silicon regions source-drain and a trench capacitor 9 are formed on a p-type substrate 1. The trench capacitor is formed by the n+ silicon layer, an $SiO_2$ layer 7 and a first polycrystalline silicon layer 3. Further, a second polycrystalline silicon layer 5 acts as a bit line, and an aluminum layer 6 and a polycide layer 4 act as word lines.

In the DRAM shown in FIG. 1, when the size of the DRAM is miniaturized, to increase the degree of integration, the element isolation effect is reduced and a leak is generated between the trench capacitors 9, and the source and drain regions (n+ silicon regions).

FIG. 2 shows another conventional example, which is an improvement of the conventional device shown in FIG. 1. In FIG. 2, to prevent the leakage between the trench capacitors, isolation between the trench capacitors 9 is also provided by forming a trench. In the structure of FIG. 2, the leakage between the trench capacitors is prevented, but to increase the degree of integration, the depth of the trench capacitor must be increased, and the process for increasing the depth of the trench capacitor is very difficult. In FIG. 2, 8 is a transfer gate, 10 is a silicon substrate, 11 is an isolation trench, 12 is a polycrystalline silicon layer (cell plate), 13 is a polycrystalline silicon layer, 14 is a capacitor insulating layer of, for example, $SiO_2$ and 15 is a silicon nitride layer.

FIG. 3 shows a conventional isolation merged vertical capacitor (IVEC) cell type structure in which a capacitor is formed at both sides of an isolation trench, and a cell plate is formed in the same trench. Nevertheless, if this structure is further miniaturized, the capacitance becomes small, and thus the depth of the trench must be increased to increase the capacitance, and as explained above, the process for increasing the depth of the trench is difficult.

The reference numbers used in FIG. 3, which are the same as those used in FIGS. 1 and 2, denote the same elements. This holds true throughout the remaining Figures.

SUMMARY OF THE INVENTION

The object of the present invention is to provide a semiconductor device and a method for producing same in which the above mentioned leakage between trench capacitors and between transistors can be prevented.

Another object of the present invention is to provide a semiconductor device which is suitable for use in a miniaturized device, and a method for producing same.

According to the present invention, there is provided a semiconductor device comprising:

trench capacitors formed in a semiconductor substrate, an isolation trench provided therebetween said trench capacitors, and a trench capacitor formed in the sidewall of said isolation trench for isolating the trench capacitors.

According to the present invention, there is further provided a method for producing a semiconductor device, comprising the steps of:

forming a first isolation trench in a semiconductor substrate, forming a first insulating layer so that the first isolation trench is filled therewith, forming a second trench in the substrate using the first insulating layer as a mask, and after removing at least a part of the first insulating layer in the first isolation trench, forming capacitor electrodes in the first and second isolation trenches.

DESCRIPTION OF THE PREFERRED EMBODIMENTS

The preferred embodiment of the present invention will be described with reference to the drawings.

Figure 1:
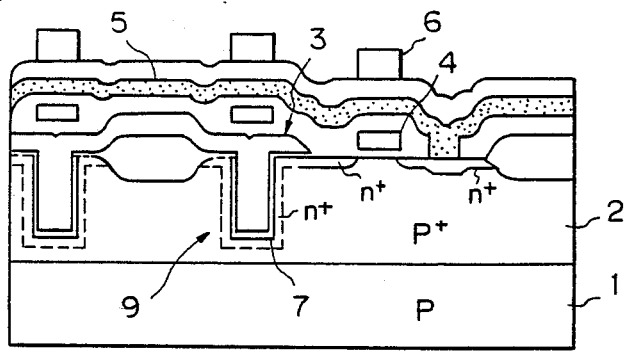
FIG. 1 shows a conventional example in which trench type capacitors are provided with a Locus type isolation therebetween.
Figure 2:
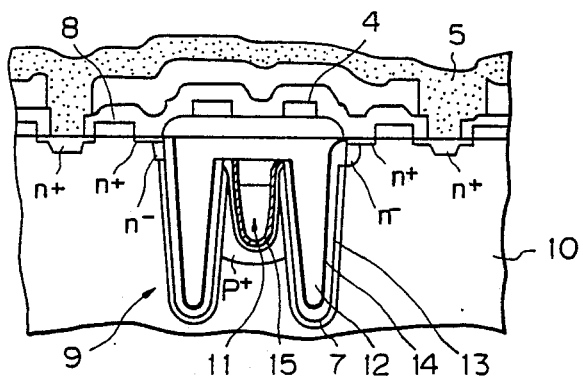
FIG. 2 shows another conventional example which is an improvement of the conventional device shown in FIG. 1.
Figure 3:
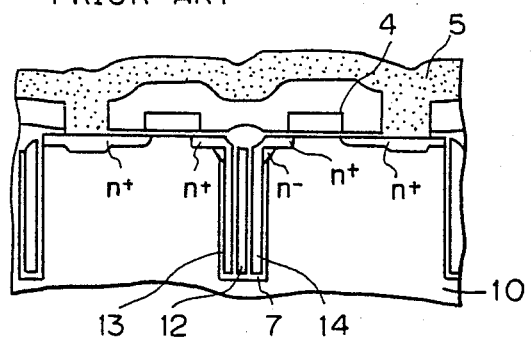
FIG. 3 shows a conventional isolation merged vertical capacitor (IVEC) cell type structure in which a capacitor is formed at both sides of an isolation trench and a cell plate is formed in the isolation trench.
Figure 4:
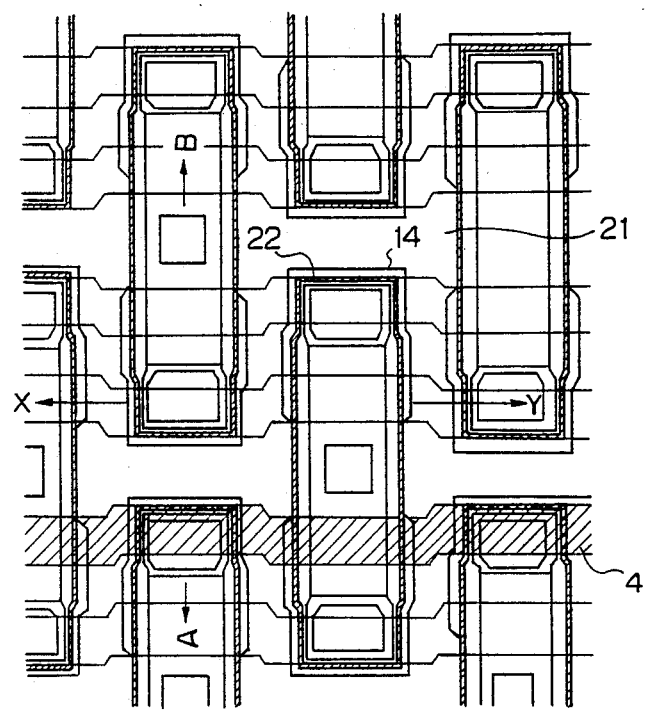
FIG. 4 is a plan view of an embodiment of the present invention.
Figure 5:
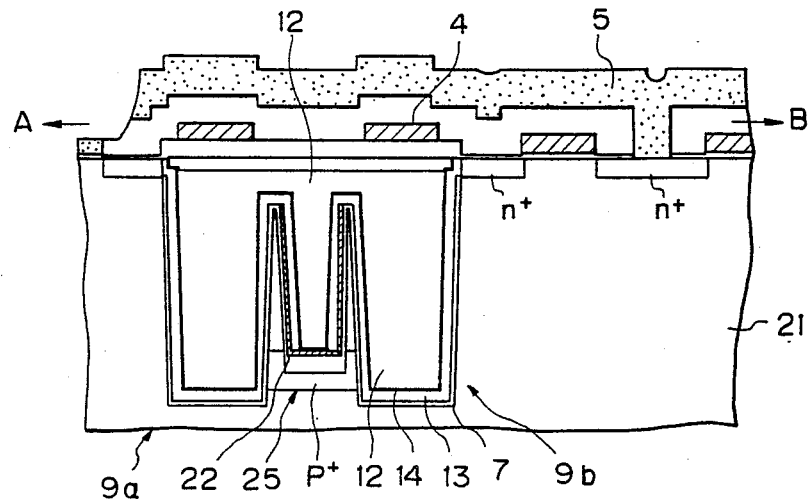
FIGS. 5 and 6 are an AB cross-sectional view and an XY cross-sectional view of FIG. 4, respectively.
Figure 6:
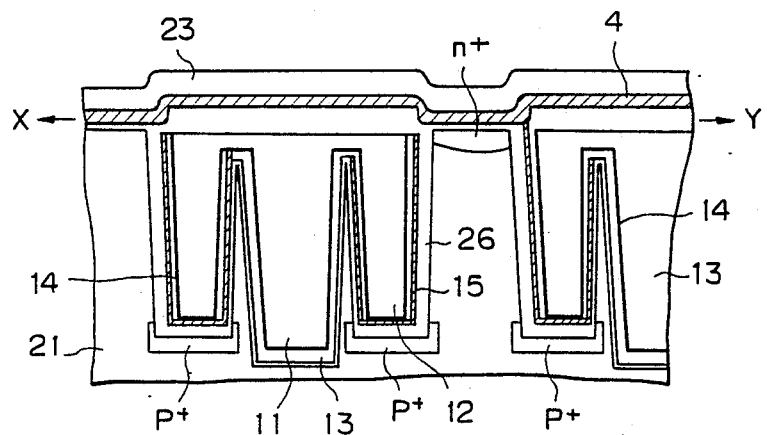

FIG. 4 is a plan view of an example of the present invention, and FIGS. 5 and 6 are an AB cross-sectional view and an XY cross-sectional view of FIG. 4, respectively.

As shown in FIG. 5, an isolation trench 25 is formed between trench capacitors 9a and 9b. The isolation trench has a depth of 3 μm. Further, in the isolation trench 25, storage node 13 of polycrystalline silicon is formed between a nitride layer 22 and a capacitor insulating layer 14. Furthermore, a cell plate 12 of polycrystalline silicon is formed on the capacitor insulating layer 14.

Therefore, in the present invention, the isolation trench 25 provides an isolation zone between the trench capacitors 9a and 9b and functions as a trench capacitor. The structure of the trench capacitors 9a and 9b consists of an $SiO_2$ layer 7, a storage node 13, a capacitor insulating nitride layer 14, and a cell plate 12.

Namely since in this example, another isolation trench and additional capacitor are formed between conventional trench capacitors not only can isolation be provided between the trench capacitors but also an increase of the capacitance thereof can be realized.

The method for providing the semiconductor device according to the present invention will now be explained with reference to FIGS. 7A and 7D and FIGS. 8A and 8D.

Figure 7A:
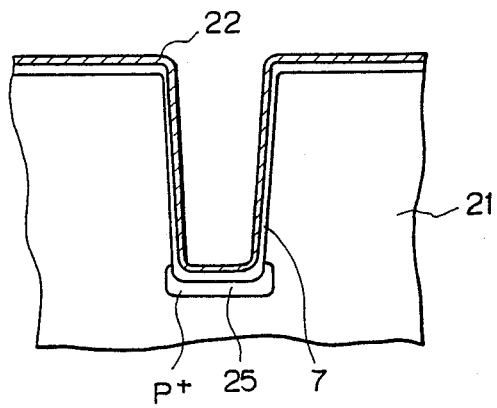
FIGS. 7A to 7D are step cross-sectional views taken along line AB of FIG. 4, and FIGS. 8A to 8D are step cross-sectional views taken along line XY of FIG. 4.
Figure 7B:
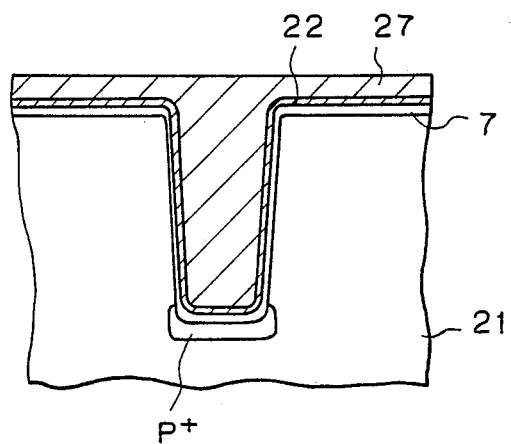
Figure 7C:
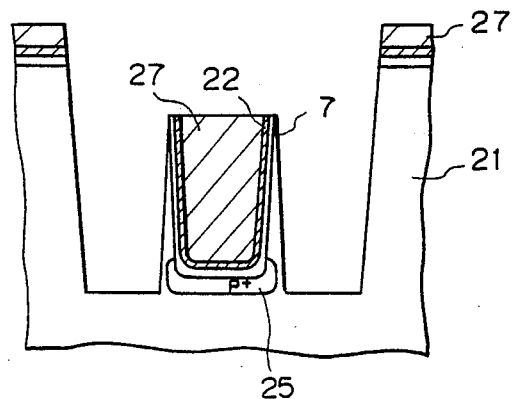
Figure 7D:
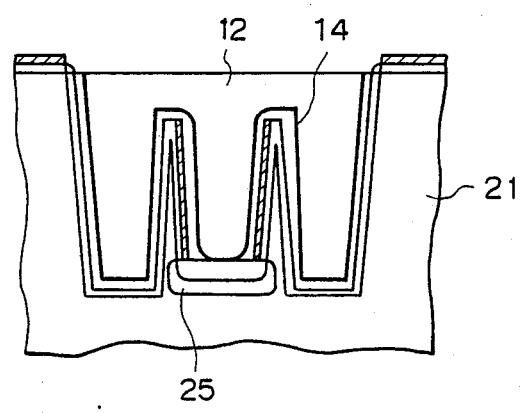

FIGS. 7A and 7D are step cross-sectional views taken along line AB of FIG. 4, and FIGS. 8A to 8D are step cross-sectional views taken along line XY of FIG. 4.

Figure 8A:
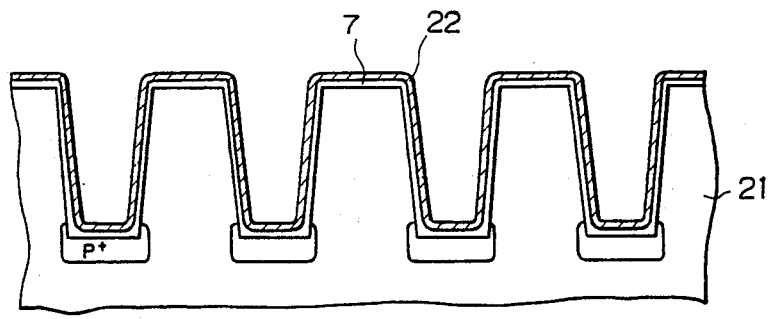

First, as shown in FIGS. 7A and 8A, after forming isolation trenches in a silicon substrate 21 by an etching process, an impurity doped region, for example, a $p^+$ type region 25, for a channel stop is formed at the bottom of the trench, the silicon substrate 21 is thermally oxidized to form an $SiO_2$ layer 7, and an $Si_3N_4$ layer 22 for the LOCUS process of the side wall is formed on the $SiO_2$ layer 7.

Figure 8B:
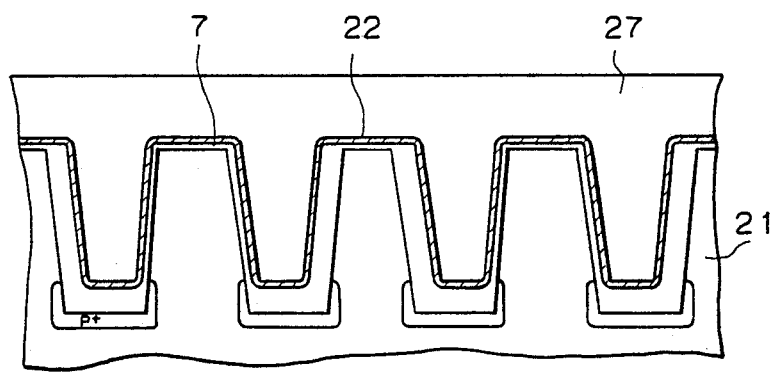

Then, as shown in FIGS. 7B and 8B, a phosphosilicate glass (PSG) 27 is embedded in the trench. The PSG 27 is used as a mask for etching the trench to produce a capacitor.

Figure 8C:
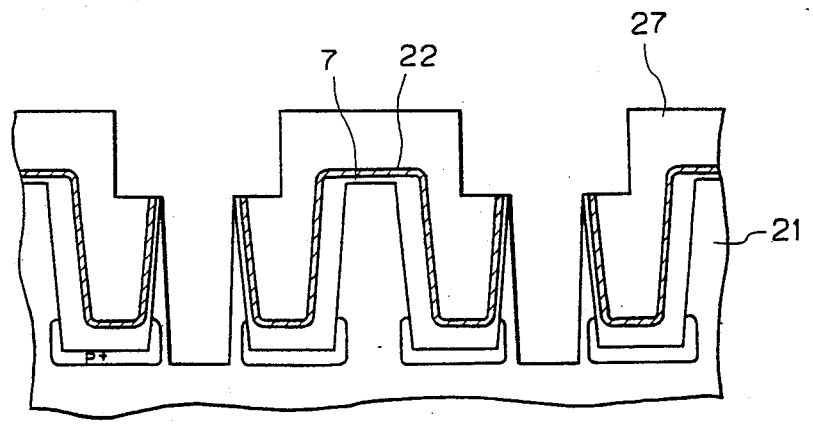

As shown in FIGS. 7B and 8C, the Si substrate is etched using the PSG 27 as a mask, by a self-alignment process, to form a conventional capacitor trench.

Figure 8D:
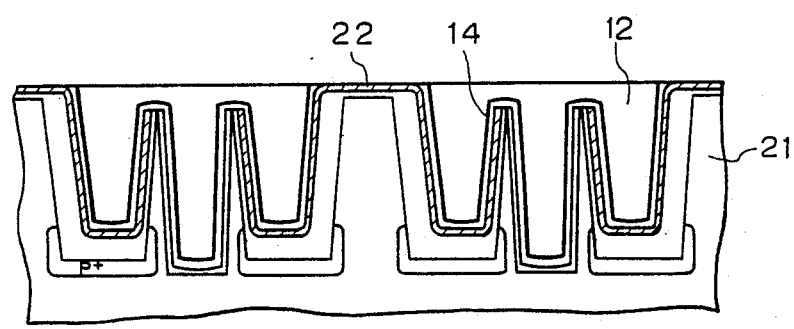

Subsequently, as shown in FIGS. 7D and 8D, the PSG 27 on the surface and in the trench is removed, an electron charge accumulated layer 13 is formed, electrode portions adjacent to the capacitors are separated by a photolithography process, a capacitor insulating layer 22 of $Si_3N_4$ is formed by a CVD process, and then a polycrystalline silicon layer is formed on the entire surface by a CVD process, to fill the trench with the polycrystalline silicon. The polycrystalline portions on the $Si_3N_4$ layer 22 are then removed by etching, so that the polycrystalline silicon is left only in the trench, whereby a cell plate 12 is formed.

Then, a transfer transistor is formed by a usual MOS FET production process, whereby a memory device provided with a trench isolation region possessing a capacitor function is obtained.

We claim:

1. A semiconductor device comprising:
   a semiconductor substrate;
   a plurality of memory cells on the semiconductor substrate, each of said memory cells comprising:
   a transistor having a gate electrode and a source-drain region; and
   a capacitance electrically coupled to said transistor, said capacitance including:
   a first trench formed in said semiconductor substrate;
   a first insulating film formed on the surface of said first trench;
   a first conducting layer formed on said first insulating film and acting as a node;
   a first dielectric film formed on said first conducting layer; and
   a second conducting layer formed on said first dielectric film and acting as a cell plate;
   isolation regions substantially surrounding each of said memory cells, each of said isolation regions comprising:
   a second trench formed in said semiconductor substrate;
   a second insulating film formed on the surface of said second trench, said first conducting layer being formed on said second insulating film and extending from said capacitance, so that the side surface of said second trench is substantially covered;
   a second dielectric film formed on said first conducting layer and extending from said capacitance; and
   a third conducting layer continuously formed on said second dielectric film and extending from said capacitance, said first conducting layer and said second dielectric film substantially surrounding said capacitance and extending to a position below said gate electrode of said transistor.

2. A semiconductor device according to claim 1, wherein said first, second and third conducting layers are formed by polycrystalline silicon.

3. A semiconductor device according to claim 2, wherein said second and third conducting layers are continuous with respect to each other.

4. A semiconductor device according to claim 2, wherein said first and second insulating films are formed by $SiO_2$ and wherein said second dielectric film is formed by nitride.

5. A semiconductor device according to claim 1, wherein said first and second insulating films are formed by $SiO_2$ and wherein said second dielectric film is formed by nitride.

* * * * *

UNITED STATES PATENT AND TRADEMARK OFFICE
CERTIFICATE OF CORRECTION

PATENT NO.  : 4,918,499

DATED       : APRIL 17, 1990

INVENTOR(S) : TAKESHI MATSUTANI ET AL.

It is certified that error appears in the above-identified patent and that said Letters Patent is hereby corrected as shown below:

Col. 1, line 28, "LOCUS" should be --LOCOS--.

Col. 2, line 36, "LOCUS" should be --LOCOS--.

Col. 3, line 29, "LOCUS" should be --LOCOS--.

line 35, "7B" should be --7C--.

Signed and Sealed this

Twenty-third Day of July, 1991

Attest:

HARRY F. MANBECK, JR.

*Attesting Officer*   *Commissioner of Patents and Trademarks*